US012666533B2

(12) United States Patent
Xu et al.

(10) Patent No.: US 12,666,533 B2
(45) Date of Patent: Jun. 23, 2026

(54) WIRING SUBSTRATE AND ELECTRONIC DEVICE

(71) Applicants: Hefei BOE Ruisheng Technology Co., Ltd., Hefei (CN); BOE Technology Group Co., Ltd., Beijing (CN)

(72) Inventors: Jiawei Xu, Beijing (CN); Zouming Xu, Beijing (CN); Xintao Wu, Beijing (CN); Xiaoxiang Zhang, Beijing (CN); Jie Wang, Beijing (CN); Ningyu Luo, Beijing (CN); Tingwei Han, Beijing (CN)

(73) Assignees: Hefei BOE Ruisheng Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 222 days.

(21) Appl. No.: 18/688,897

(22) PCT Filed: Jul. 22, 2022

(86) PCT No.: PCT/CN2022/107448
§ 371 (c)(1),
(2) Date: Mar. 4, 2024

(87) PCT Pub. No.: WO2024/016332
PCT Pub. Date: Jan. 25, 2024

(65) Prior Publication Data
US 2024/0373552 A1     Nov. 7, 2024

(51) Int. Cl.
*H05K 1/11*     (2006.01)
*H05K 1/02*     (2006.01)
(52) U.S. Cl.
CPC ........... *H05K 1/111* (2013.01); *H05K 1/0284* (2013.01)

(58) Field of Classification Search
None
See application file for complete search history.

(56) References Cited

U.S. PATENT DOCUMENTS 11,476,301 B2 * 10/2022 Liu ...................... H10H 20/857
11,785,715 B2 * 10/2023 Hustedt .................. H05K 1/025
                                                       361/767

(Continued)

FOREIGN PATENT DOCUMENTS

CN     109031779 A     12/2018
CN     110649042 A     1/2020

(Continued)

OTHER PUBLICATIONS

Original and Translation of CN116049042 (Year: 2020).*
PCT/CN2022/094141 international search report dated Jan. 11, 2023.

*Primary Examiner* — Timothy J. Dole
*Assistant Examiner* — Muhammed Azam
(74) *Attorney, Agent, or Firm* — IPro, PLLC

(57)     ABSTRACT
A wiring substrate includes a base substrate, a plurality of constant voltage signal lines and a plurality of first connection lines, and a plurality of first pad regions. Each of the first pad regions includes a plurality of sub-regions. Each of the sub-regions includes a plurality of pad groups. The plurality of pad groups include at least a first pad group and a last pad group. An orthographic projection of one of the first pad group and the last pad group on the base substrate is partially overlapped with an orthographic projection of one of the constant voltage signal lines on the base substrate. An orthographic projection of the other of the first pad group and the last pad group on the base substrate is partially overlapped with an orthographic projection of one of the first connection lines on the base substrate.

20 Claims, 7 Drawing Sheets

(56)     References Cited

U.S. PATENT DOCUMENTS

| | | | | |
|---|---|---|---|---|
| 2012/0061129 | A1* | 3/2012 | Lai | H05K 1/111 174/257 |
| 2018/0084614 | A1 | 3/2018 | Bower et al. | |
| 2018/0233094 | A1* | 8/2018 | Kumamoto | G09G 3/20 |
| 2022/0238771 | A1* | 7/2022 | Lei | H01L 22/32 |
| 2022/0350199 | A1* | 11/2022 | Sang | H10H 20/857 |
| 2023/0369384 | A1* | 11/2023 | Wang | H10K 59/18 |
| 2024/0282737 | A1* | 8/2024 | Sun | B23K 35/362 |
| 2024/0312917 | A1* | 9/2024 | Han | H10H 20/857 |
| 2024/0363599 | A1* | 10/2024 | Wang | H10H 20/833 |
| 2024/0363824 | A1* | 10/2024 | Luo | H01L 25/167 |
| 2024/0373552 | A1* | 11/2024 | Xu | H05K 1/02 |
| 2025/0126954 | A1* | 4/2025 | Kuo | H01L 25/0753 |

FOREIGN PATENT DOCUMENTS

| | | | | | |
|---|---|---|---|---|---|
| CN | 113130463 | A | * | 7/2021 | H10W 90/00 |
| CN | 113168046 | A | | 7/2021 | |
| CN | 113498490 | A | | 10/2021 | |
| CN | 113964112 | A | * | 1/2022 | H10W 90/00 |
| CN | 114171661 | A | | 3/2022 | |
| CN | 114280841 | A | | 4/2022 | |
| CN | 114442353 | A | | 5/2022 | |
| CN | 114823762 | A | * | 7/2022 | H10W 90/00 |
| CN | 115084345 | A | * | 9/2022 | G09F 9/33 |
| CN | 115472732 | A | * | 12/2022 | H10W 90/00 |
| CN | 116489874 | A | * | 7/2023 | H05K 1/0313 |
| WO | 2021062630 | A1 | | 4/2021 | |
| WO | 2022110238 | A1 | | 6/2022 | |

* cited by examiner

WIRING SUBSTRATE AND ELECTRONIC DEVICE

CROSS-REFERENCE TO RELATED APPLICATION

The present disclosure is a U.S. national stage of international application No. PCT/CN2022/107448, filed on Jul. 22, 2022, the content of which is herein incorporated by reference in its entirety.

TECHNICAL FIELD

The present disclosure relates to the field of display technologies, and in particular, relates to a wiring substrate and an electronic device.

BACKGROUND

Micro light-emitting diodes, which are approximately less than 500 μm in size, are becoming widely used in the display field due to their advantages of smaller size, ultra-high brightness, long life, and the like.

SUMMARY

Embodiments of the present disclosure provide a wiring substrate and an electronic device. The technical solutions are as follows.

According to some embodiments of the present disclosure, a wiring substrate is provided. The wiring substrate includes:

a base substrate;

a plurality of constant voltage signal lines and a plurality of first connection lines that are disposed on a same side of the base substrate;

a plurality of first pad regions, wherein each of the first pad regions includes a plurality of sub-regions arranged in parallel, each of the sub-regions including a plurality of pad groups arranged in series, the plurality of pad groups arranged in series including at least a first pad group and a last pad group, an orthographic projection of one of the first pad group and the last pad group on the base substrate being partially overlapped with an orthographic projection of one of the constant voltage signal lines on the base substrate, an orthographic projection of the other of the first pad group and the last pad group on the base substrate being partially overlapped with an orthographic projection of one of the first connection lines on the base substrate.

In some embodiments, one of the first pad group and the last pad group is coupled to one of the constant voltage signal lines, and the other of the first pad group and the last pad group is coupled to one of the first connection lines.

In some embodiments, the plurality of first pad regions are arranged in an array, each of the constant voltage signal lines extends along a first direction, each of the first connection lines extends along the first direction, and the plurality of constant voltage signal lines are spaced apart along a second direction.

In some embodiments, the wiring substrate further includes a second connection line, wherein the plurality of pad groups in the sub-region are connected in series by the second connection line.

In some embodiments, an extension direction of the second connection line is intersected with an extension direction of the first connection line.

In some embodiments, the wiring substrate further includes a plurality of second pad regions, wherein each of the second pad regions includes an output pad, the output pad being connected to at least one of the first pad regions.

In some embodiments, at least two of the plurality of second pad regions are coupled by one of the first connection lines.

In some embodiments, each of the plurality of second pad regions further includes an address pad, and one end of at least one of the first connecting lines is connected to the output pad of one of the second pad regions, and the other end of the first connecting line is connected to the address pad of the other of the second pad regions.

In some embodiments, the wiring substrate further includes a plurality of common voltage signal lines, wherein each of the common voltage signal lines extends along a first direction, the plurality of common voltage signal lines are spaced apart along a second direction, each of the second pad regions further includes a ground pad, the plurality of second pad regions are arranged in an array, and the ground pads of a plurality of the second pad regions arranged along the first direction are connected to one of the common voltage signal lines.

In some embodiments, a ratio of a width of the constant voltage signal line to a width of the common voltage signal line is greater than or equal to 0.5 and less than or equal to 1.5.

In some embodiments, a ratio of a width of the constant voltage signal line to a width of the first connection line is greater than or equal to 4 and less than or equal to 10.

In some embodiments, the first pad region includes two of the sub-regions arranged in parallel, wherein one of the two sub-regions includes a first pad group and a second pad group that are arranged in series, and the other of the two sub-regions includes a third pad group and a fourth pad group that are arranged in series;

wherein the first pad group is juxtaposed with the second pad group in a second direction and is juxtaposed with the third pad group in a first direction, and the fourth pad group is juxtaposed with the second pad group in the first direction and is juxtaposed with the third pad group in the second direction.

According to some embodiments of the present disclosure an electronic device is provided. The electronic device includes the wiring substrate as described above and an electronic element connected to the first pad region.

In some embodiments, the electronic device further includes a first transparent protection structure, wherein an orthographic projection of the first transparent protection structure on the base substrate covers an orthographic projection of the electronic element on the base substrate.

In some embodiments, the electronic device further includes a micro drive chip and a second transparent protection structure, wherein the micro drive chip is connected to the second pad region, and an orthographic projection of the second transparent protection structure on the base substrate covers an orthographic projection of the micro drive chip on the base substrate.

DETAILED DESCRIPTION

Figure 1:
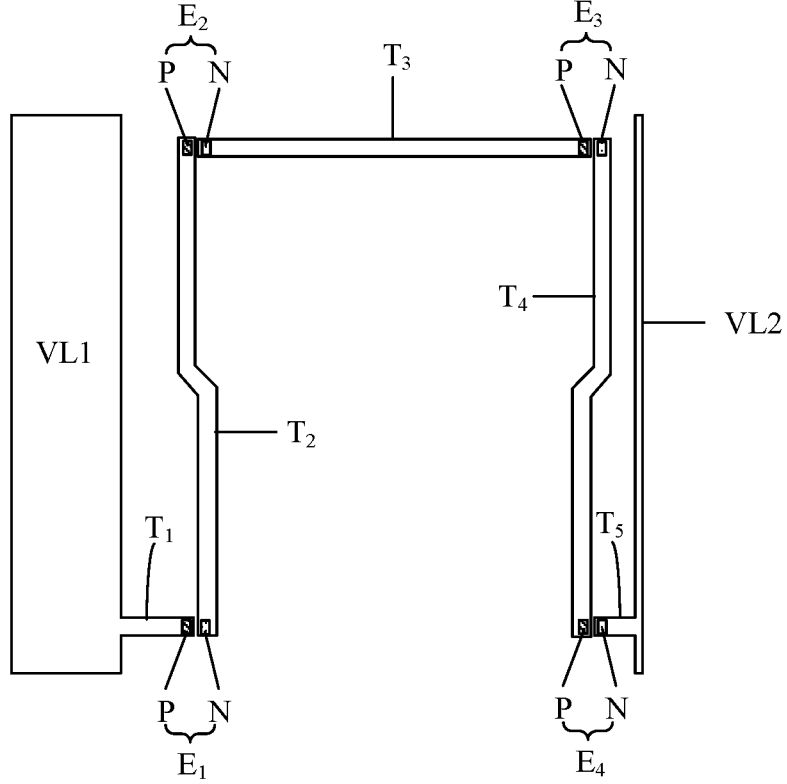
FIG. 1 is a partial schematic structural diagram of a wiring substrate in some practices.

The present disclosure is described in further detail with reference to the accompanying drawings, to clearly present the objects, technical solutions, and advantages of the present disclosure. It should be noted that the dimensions and shapes of the figures in the accompanying drawings do not reflect true proportions and are intended to schematically illustrate the present disclosure only. Moreover, the same or similar referring numerals indicate the same or similar elements or elements having the same or similar function. For the clarity and conciseness of the following description of the embodiments of the present disclosure, detailed descriptions of known functions and known components are omitted from the present disclosure.

It should be noted that unless otherwise defined, technical or scientific terms used in the embodiments of the present disclosure shall have ordinary meanings understandable by persons of ordinary skill in the art to which the disclosure belongs. The terms "first," "second," and the like used in the embodiments of the present disclosure are not intended to indicate any order, quantity or importance, but are merely used to distinguish the different components. The terms "comprise," "include," and derivatives or variations thereof are used to indicate that the element or object preceding the terms covers the element or object following the terms and its equivalents, and shall not be understood as excluding other elements or objects. The terms "on," "under," "left," and "right" are only used to indicate the relative positional relationship. When the absolute position of the described object changes, the relative positional relationship may change accordingly.

The applications of micro light-emitting diodes (e.g., Mini LEDs, Micro LEDs) in the display field are mainly categorized into direct display and backlight. Direct display has a greater market potential in the field of commercial and professional displays, such as traffic management command centers and large displays in commercial plazas. As for the application in the field of backlight, due to the small size of the micro light-emitting diode, the light mixing distance between adjacent micro light-emitting diodes is greatly shortened, such that the micro light-emitting diodes have the advantages of adjustable region brightness, high color rendering, high contrast, and the like. Meanwhile, the characteristics of thinner thickness, more power-saving, and bendability also make the application of micro light-emitting diodes more flexible. Most importantly, compared to organic light-emitting diodes, micro light-emitting diodes have a lower cost, longer life, and there is no risk of burn-in.

In some practices, a backplane for providing signals to the micro light-emitting diode is fabricated using a single wiring layer. In the structure of a light region on a backplane shown in FIG. 1, each light region includes pad groups to be connected to four micro light-emitting diodes. A first wiring $T_1$ is led from a first signal line VL1 and connected to a first pad P of a pad group $E_1$, then a second pad N of the pad group $E_1$ is connected to a first pad P of the pad group $E_2$ via a second wiring $T_2$, then a second pad N of the pad group $E_2$ is connected to a first pad P of the pad group $E_3$ via a third wiring $T_3$, then a second pad N of the pad group $E_3$ is connected to a first pad P of a pad group $E_4$ via a fourth wiring $T_4$, and then a second pad N of the pad group $E_4$ is connected to a second signal line VL2 via a fifth wiring $T_5$.

In some practices, the backplane for providing signals to micro light-emitting diode is fabricated using two wiring layers. Although the backplane including only a single wiring layer has the advantage of low cost, compared to the backplane in which different types/functions of signal lines in the backplane are arranged separately in the two wiring layers, the backplane including only a single wiring layer has limited wiring space, and the linewidths of the signal lines are limited, or it is difficult to achieve the effect of the narrow bezel.

For the improvement of the above technical problems in some practices, some embodiments of the present disclosure provide a wiring substrate, as shown in FIG. 2 to FIG. 5. The wiring substrate includes:

a base substrate 101;

a plurality of constant voltage signal lines 102 and a plurality of first connection lines 103 that are disposed on the same side of the base substrate 101; and a plurality of first pad regions 104. Each of the first pad regions 104 includes a plurality of sub-regions 104' arranged in parallel, and each of the sub-regions 104' includes a plurality of pad groups (e.g., $E_{11}$, $E_{12}$, $E_{21}$, or $E_{22}$) arranged in series. One of the pad groups (e.g., $E_{11}$, $E_{12}$, $E_{21}$, or $E_{22}$) at least includes a first pad P and a second pad N. One of the pad groups (e.g., $E_{11}$, $E_{12}$, $E_{21}$, or $E_{22}$) is connected to an electronic element. The plurality of pad groups (e.g., $E_{11}$ and $E_{12}$, $E_{21}$, and $E_{22}$) arranged in series include at least a first pad group (e.g., $E_{11}$ and $E_{21}$) and a last pad group (e.g., $E_{12}$ and $E_{22}$). An orthographic projection of one of the first pad group (e.g., $E_{11}$ and $E_{21}$) and the last pad group (e.g., $E_{12}$ and $E_{22}$) on the based substrate 101 is partially overlapped with an orthographic projection of one of the constant voltage signal lines 102 on the substrate 101, and an orthographic projection of the other of the first pad group (e.g., $E_{11}$ and $E_{21}$) and the last pad group (e.g., E12 and $E_{22}$) on the based substrate 101 is partially overlapped with an orthographic projection of one of the first connection lines 103 on the base substrate 101. Specifically, an orthographic projection of the first pad P of the first pad group (e.g., $E_{11}$ and $E_{21}$) is overlapped the orthographic projection of one of the constant voltage signal lines 102 on the base substrate 101, and an orthographic projection of the second pad N of the last pad group (e.g., $E_{12}$ and $E_{22}$) is overlapped with the orthographic projection of one of the first connection lines 103 on the base substrate 101.

In the wiring substrate according to the embodiments of the present disclosure described above, the electrical connection relationship of the plurality of pad groups in the first pad region is changed. Specifically, all the pad groups successively connected in series are changed to at least two pad groups E connected in series to form the sub-region 104', and then the plurality of sub-regions are connected in parallel with each other to form the first pad region 104. Moreover, The orthographic projection of one of the first pad group (e.g., $E_{11}$ and $E_{21}$) and the last pad group (e.g., $E_{12}$ and $E_{22}$) among the pad groups E connected in series with each other in the sub-region 104' on the based substrate 101 is partially overlapped with the orthographic projection of one of the constant voltage signal lines 102 on the substrate 101, and the orthographic projection of the other on the substrate 101 is partially overlapped with the orthographic projection of one of the first connection lines 103 on the base substrate 101. In this way, the number of wirings connecting different pad groups E is reduced, such that the wiring space is saved. In some embodiments, the widths of the constant voltage signal line 102 and the common voltage signal line 105 are further increased, such that the IR-drop is reduced without the need to increase the thickness of the signal line, and thus the cost is effectively reduced.

In some embodiments, in the wiring substrate according to some embodiments of the present disclosure described above, as shown in FIG. 2 to FIG. 5, within each of the sub-regions 104', one of the first pad group (e.g., $E_{11}$) and the last pad group (e.g., $E_{12}$) is coupled to one of the constant voltage signal lines 102, and the other of the first pad group (e.g., $E_{11}$) and the last pad group (e.g., $E_{12}$) is coupled to one of the first connection lines 103. Optionally, within each of the sub-regions 104', the first pad P of the first pad group (e.g., $E_{11}$ and $E_{21}$) is coupled to the constant voltage signal line 102, and the second pad N of the last pad group (e.g., $E_{12}$ and $E_{22}$) is coupled to the first connection line 103. That is, the first pads P of the respective first pad groups (e.g., $E_{11}$ and $E_{21}$) are coupled by the constant voltage signal line 102, and the second pads N of the respective last pad groups (e.g., $E_{12}$ and $E_{22}$) are coupled by the first connection line 103.

Compared with the practices shown in FIG. 1, in the embodiments of the present disclosure, there is no need to arrange the first wiring T1, the second wiring T2, the fourth wiring T4, and the fifth wiring T5, which facilitates the achievement of the narrow bezel design, and by the constant voltage signal line 102 and the common voltage signal line 105 that are disposed on the wiring substrate, a larger width design is achieved. The wider constant voltage signal line 102 and the wider common voltage signal line 105 not only help reduce the production cost but also improve the heat dissipation performance of the wiring substrate.

In some embodiments of the present disclosure, both the constant voltage signal line 102 and the common voltage signal line 105 on the wiring substrate transmit analog voltage signals with a constant amplitude, and the first connection line transmits digital voltage signals. In some embodiments of the present disclosure, a ratio of a width of the constant voltage signal line 102 to a width of the first connection line 103 is greater than or equal to 4 and less than or equal to 10. For example, the ratio of the two is 4, 5, 6, 7, 8, 9, 10, or the like. Optionally, the width of the first connection line 103 is 320 µm and the width of the constant voltage signal line 102 is 2800 µm. In the present disclosure, a ratio of the width of the constant voltage signal line 102 to a width of the common voltage signal line 105 is greater than or equal to 0.5 and less than or equal to 1.5. For example, the ratio of the two is 0.5, 0.6, 0.7, 0.8, 0.9, 1, 1.1, 1.2, 1.3, 1.4, 1.5, or the like, Optionally, the width of the constant voltage signal line 102 is 2800 µm, and the width of the common voltage signal line 105 is 2580 µm. In some practices shown in FIG. 1, the width of the constant voltage signal line (VLED) is 1400 µm, and the width of the common voltage signal line (GND) is 2000 µm. In comparison, the width of the constant voltage signal line 102 in the present disclosure is substantially increased, and the width of the common voltage signal line 105 is increased by 29%.

According to wiring resistance R=(line length/line width)*sheet resistance, the resistance R is inversely proportional to the line width of the wiring. Therefore, the line width of the wiring is improved by the same magnitude as the reduction of the resistance R. Moreover, according to the equation that the voltage drop ΔU=ΔR*I, the voltage drop ΔU is directly proportional to the resistance change amount ΔR (corresponding to the reduction magnitude of the resistance R). Therefore, in a case where the current I is constant, the reduction magnitude of the voltage drop ΔU is the same as the reduction magnitude of the resistance R (i.e., the improvement magnitude of the line width of the wiring).

Figure 2:
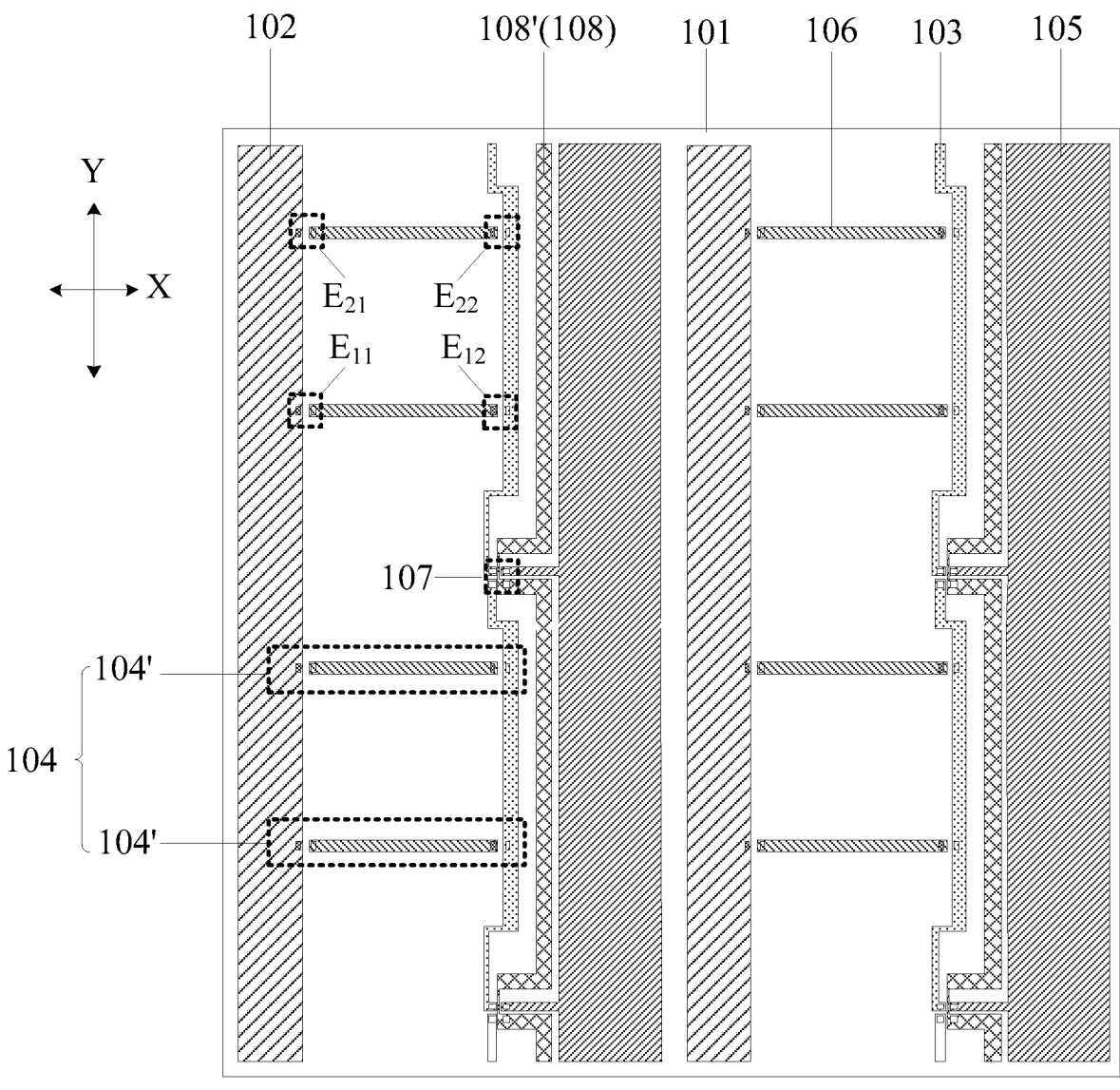
FIG. 2 is a schematic structural diagram of a wiring substrate according to some embodiments of the present disclosure.

In some embodiments, in the above-described wiring substrate according to some embodiments of the present disclosure, as shown in FIG. 2, the plurality of first pad regions 104 are arranged in an array, each of the constant voltage signal lines 102 extends along a first direction Y, each of the first connection lines 103 extends along the first direction Y, and the plurality of constant voltage signal lines 102 are spaced apart along a second direction X, such that a column of the first pad regions 104 is correspondingly connected to one of the constant voltage signal lines 102, and the sub-regions 104' adjacent to each other in the first direction Y are connected by the first connection line 103.

Figure 3:
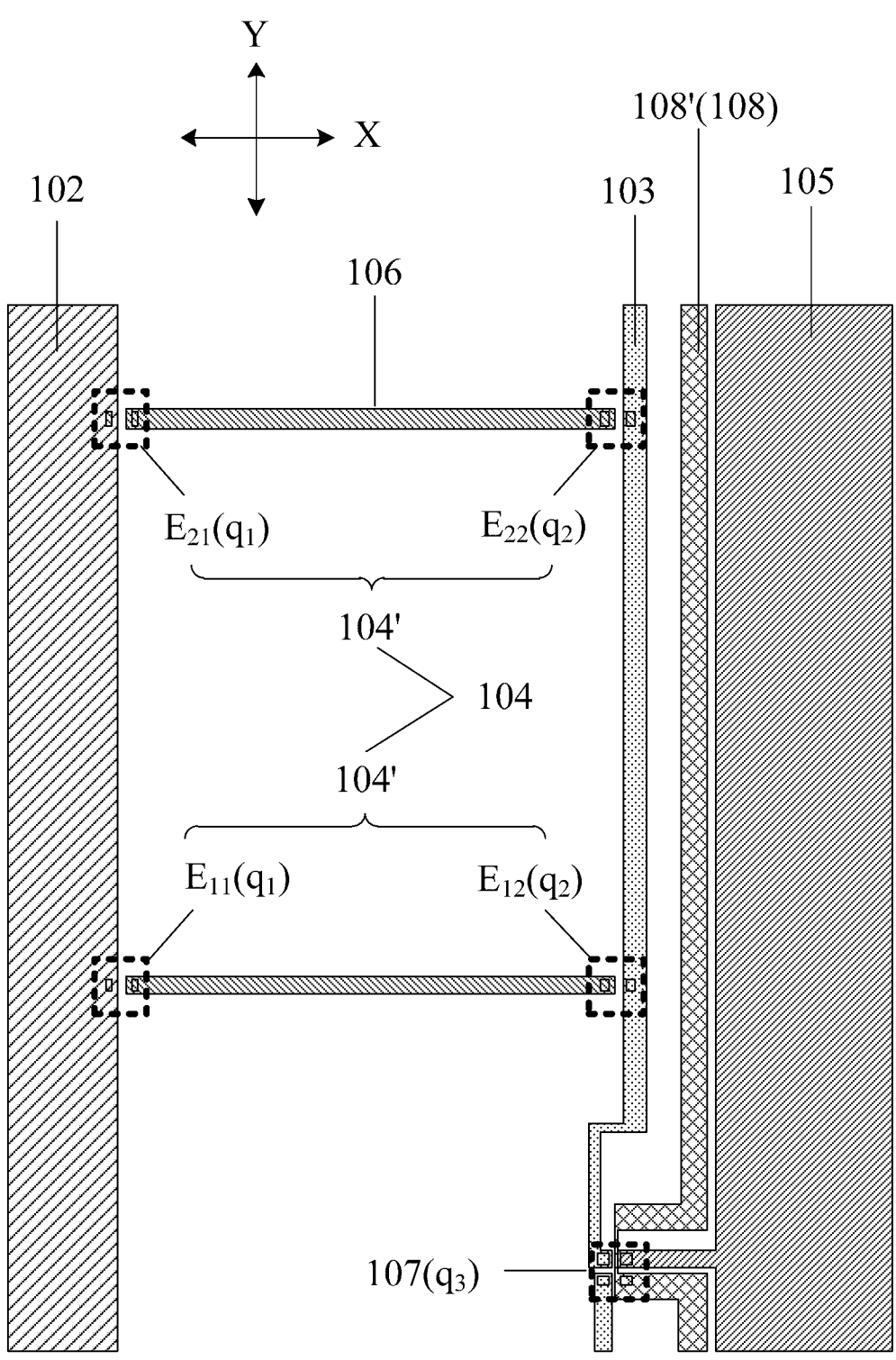
FIG. 3 is a schematic structural diagram of a light region according to some embodiments of the present disclosure.
Figure 4:
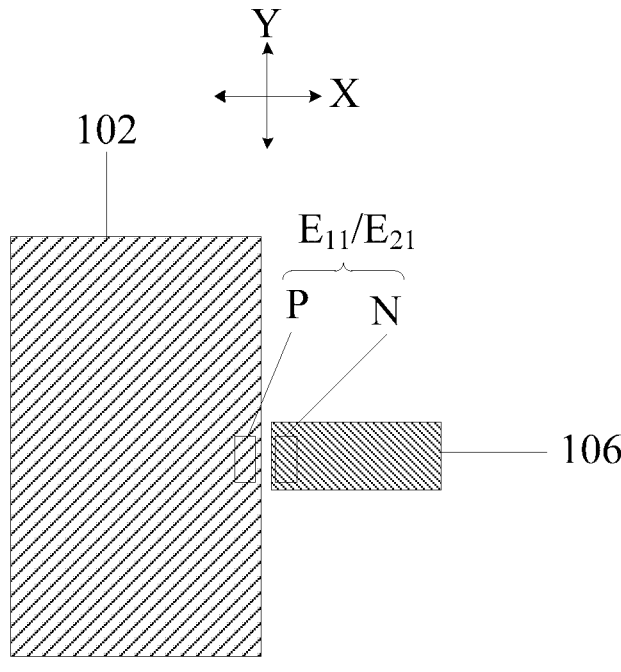
FIG. 4 is an enlarged structural diagram of a region q1 in FIG. 3.
Figure 5:
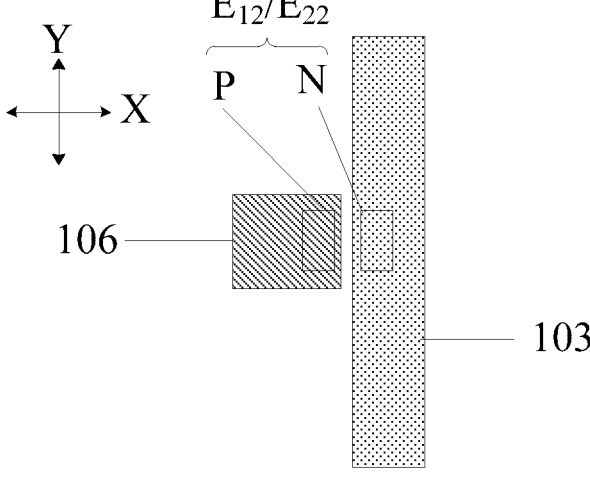
FIG. 5 is an enlarged structural diagram of a region q2 in FIG. 3.

In some embodiments, in the above-described wiring substrate according to some embodiments of the present disclosure, as shown in FIG. 2 and FIG. 3, the wiring substrate further includes a second connection line 106. The plurality of pad groups (e.g., $E_{11}$ and $E_{12}$, $E_{21}$, and $E_{22}$) of each of the sub-regions 104' are connected in series by the second connection line 106. Exemplarily, as shown in FIG. 3, the first pad region 103 in the present disclosure includes two sub-regions 104' arranged in parallel, wherein one of the sub-regions 104' includes the first pad group $E_{11}$ and the second pad group $E_{12}$ that are arranged in series by one of the second connection lines 106, and the other sub-region 104' includes the third pad group $E_{21}$ and the fourth pad group $E_{22}$ that are arranged in series by another second connection line 106. The first pad group $E_{11}$ is juxtaposed in the second direction X with the second pad group $E_{12}$, and is juxtaposed with the third pad group $E_{21}$ in the first direction Y. The fourth pad group $E_{22}$ is juxtaposed with the second pad group $E_{12}$ in the first direction Y, and is juxtaposed with the third pad group $E_{21}$ in the second direction X.

In some embodiments, in the above-described wiring substrate according to some embodiments of the present disclosure, as shown in FIG. 3, an extension direction of the second connection line 106 and an extension direction of the first connection line 103 are intersected with each other, such that the second connection line 106 extends along a single direction, the line length of the second connection line 106 is ensured to be short, and the voltage drop within the sub-region 104' is reduced. For example, the extension direction of the first connection line 103 is the first direction Y and the extension direction of the second connection line 106 is the second direction X.

Figure 6:
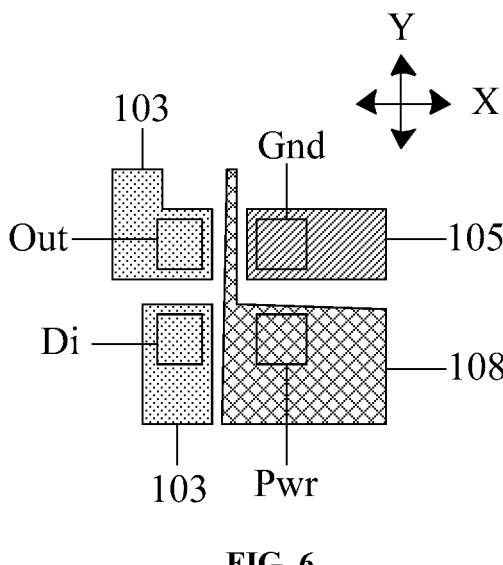
FIG. 6. is an enlarged structural diagram of a region q3 FIG. 3.

In some embodiments, in the above-described wiring substrate according to some embodiments of the present disclosure, as shown in FIG. 2, FIG. 3, and FIG. 6, the wiring substrate further includes a plurality of second pad regions 107. Each of the plurality of second pad regions is used to connect to a micro drive chip. Each of the second pad regions 107 includes an output pad Out. The output pad Out is connected to at least one of the first pad regions 104. Optionally, the output pad Out is connected to the first pad region 104 by the first connection line 103.

In some embodiments, in the above-described wiring substrate according to some embodiments of the present disclosure, as shown in FIG. 2, FIG. 3, and FIG. 6, there are at least two second pad regions 107 coupled by one of the first connection lines 103. Each of the second pad regions 107 also includes an address pad Di. There is at least one first connection line 103, with one end coupled to the output pad Out of one of the second pad regions 107 and the other end coupled to the address pad Di of the other second pad region 107.

In some embodiments, in the above-described wiring substrate according to some embodiments of the present disclosure, as shown in FIG. 2, FIG. 3, and FIG. 6, there are a plurality of common voltage signal lines 105. Each of the common voltage signal lines 105 extends along the first direction Y, and the plurality of common voltage signal lines 105 are spaced apart along the second direction X. The second pad region 107 further includes a ground pad Gnd. The plurality of second pad regions 107 are arranged in an array, and the ground pads Gnd of the plurality of second pad regions 107 arranged along the first direction Y are connected to one of the common voltage signal lines 105.

In some embodiments, in the above-described wiring substrate according to some embodiments of the present disclosure, as shown in FIG. 2, FIG. 3, and FIG. 6, the wiring substrate further includes a power signal line 108 with a plurality of sub-segments 108'. One of the sub-segments 108' is coupled to power supply pads Pwr of two of the second pad regions 107 in a row, such that the same one power supply signal line 108 powers the power supply pads Pwr of the plurality of second pad regions 107 that are cascaded in the same column.

In some embodiments, in the above-described wiring substrate according to some embodiments of the present disclosure, the wiring substrate further includes an insulation layer with a plurality of hollowed-out structures. The insulation layer is disposed on a side, furthest away from the substrate, of all the wiring layers. The respective hollowed-out structures expose a partial surface of partial wiring, such that the respective first pads P, the respective second respective N, the respective output respective Out, the respective address respective Di, the respective ground pads Gnd, and the respective power supply pads Pwr are formed. Optionally, the insulation layer is made of a material with high reflectivity, such as white ink.

Figure 7:
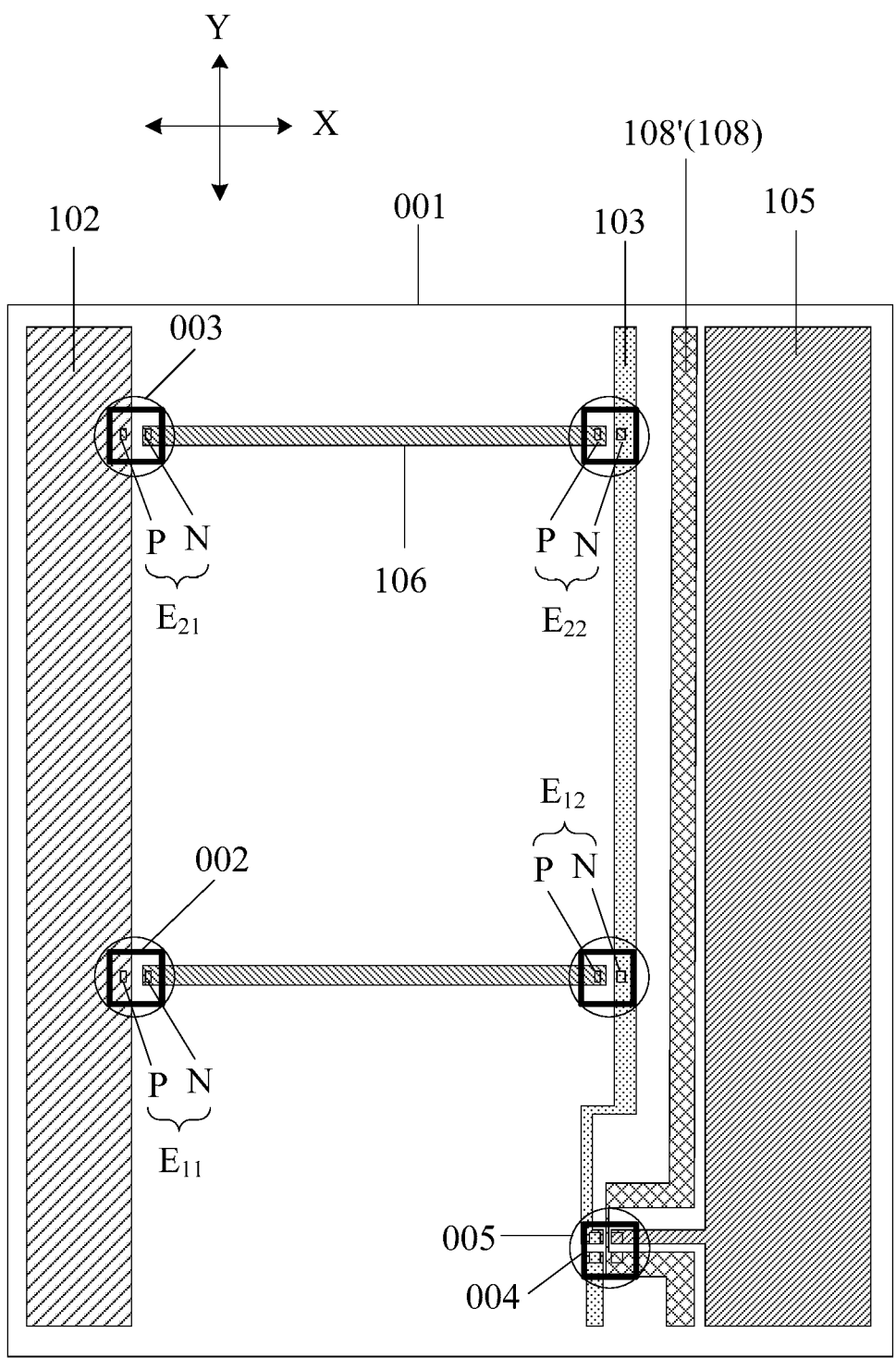
FIG. 7 is a schematic structural diagram of an electronic device according to some embodiments of the present disclosure.

Based on the same inventive concept, some embodiments of the present disclosure provide an electronic device. As shown in FIG. 3 and FIG. 7, the electronic device includes the above-described wiring substrate 001 according to some embodiments of the present disclosure and an electronic element 002 coupled to the first pad region 104. Optionally, the electronic element 002 is a light-emitting element, and a light-emitting region of the light-emitting element is no more than 300,000μμ. Specifically, the light-emitting region no more exceeds 40,000 $\mu m^2$. The light-emitting element has two pins, and each of the pad groups (e.g., $E_{11}$, $E_{12}$, $E_{21}$, $E_{22}$) includes the first pad P and the second pad N, which are correspondingly coupled to the two pins of the light-emitting element respectively. It should be appreciated that the electronic element 002 has other numbers of pins when it is another element, and accordingly, each pad group (e.g., $E_{11}$, $E_{12}$, $E_{21}$, $E_{22}$) has the same number of pads as the pins of the connected electronic element.

In some embodiments, in the above-described electronic device according to some embodiments of the present disclosure, as shown in FIG. 7, the electronic device further includes a first transparent protection structure 003. An orthographic projection of the first transparent protection structure 003 on the base substrate 101 covers an orthographic projection of the electronic element 002 on the base substrate 101, such that the electronic element 002 is protected by the first transparent protection structure 003. In a case where the electronic element 002 is a light-emitting element, the first transparent protection structure 003 also serves to enhance light efficiency.

In some embodiments, the first transparent protection structure 003 is fabricated by dispensing glue or metal stencil printing. Optionally, to achieve a better protective effect and effectively improve the light efficiency, the first transparent protection structure 003 forms a convex lens shape over the electronic element 002 (e.g., the light-emitting element), such that the light-emitting angle of the light-emitting element is adjusted.

In some embodiments, in the above-described electronic device according to some embodiments of the present disclosure, as shown in FIG. 7, the electronic device further includes a micro drive chip 004 and a second protection structure 005. The micro drive chip 004 is connected to the second pad region 107, and an area of an orthographic projection of the micro drive chip 004 on the base substrate 101 is no more than 300000 $\mu m^2$. An orthographic projection of the second protection structure 005 on the base substrate 101 covers the orthographic projection of the micro drive chip 004 on the base substrate 101, such that the micro drive chip 004 is protected by the second protection structure 005. For ease of fabrication, the fabrication requirements of the second protection structure 005 and the first transparent protection structure 003 are the same, and both are formed in the same process flow.

Figure 8:
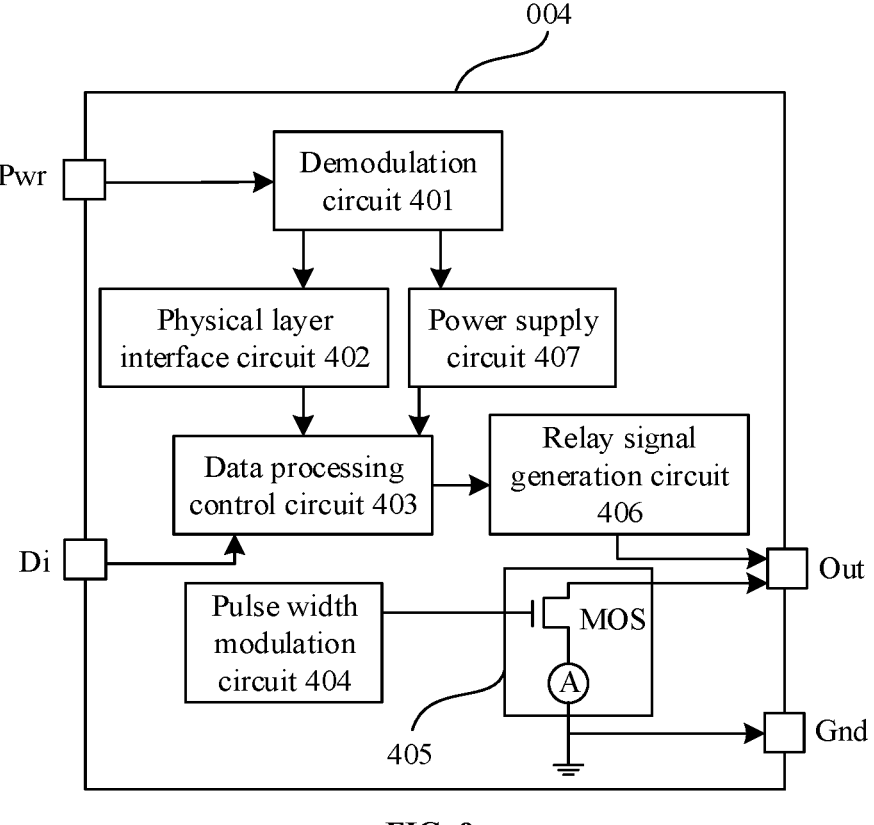
FIG. 8 is a schematic structural diagram of a micro drive chip according to some embodiments of the present disclosure.

In some embodiments, as shown in FIG. 8, the micro drive chip 004 includes a demodulation circuit 401, a physical layer interface circuit 402, a data processing control circuit 403, a pulse width modulation circuit 404, a drive signal generation circuit 405, a relay signal generation circuit 406, and a power supply circuit 407.

In some embodiments, the demodulation circuit 401 is electrically connected to the power supply pad Pwr and the physical layer interface circuit 402, and is configured to acquire communication data by demodulating a power line carrier communication signal inputted by the power supply pad Pwr, and to transmit the communication data to the physical layer interface circuit. In the case where the electronic element 002 is the light-emitting element, the communication data reflects the duration of the light emission, which represents the desired luminous intensity. Compared to the general Serial Peripheral Interface (SPI) protocol, some embodiments of the present disclosure superimpose the communication data on the power signal by using the Power Line Carrier Communication (PLC) protocol, such that the number of signal lines is effectively reduced.

In some embodiments, the physical layer interface circuit 402 is further electrically connected to the data processing control circuit 403, and is configured to acquire a data frame (e.g., frame rate data) by processing the communication data and to transmit the data frame to the data processing control circuit 403. The data frame acquired by the physical layer interface circuit 402 contains information that needs to be transmitted to the micro drive chip 004, such as information related to the light-emitting duration (e.g., a specific duration of the light emission). Optionally, the physical layer interface circuitry 402 is a general port physical layer (PHY), which may be described in detail with reference to conventional designs and is not repeated herein.

In some embodiments, the data processing control circuit 403 is also electrically connected to the address pad Di, the pulse width modulation circuit 404, and the relay signal generation circuit 406. The data processing control circuit 403 is configured to generate a pulse width control signal based on the data frame and transmit the pulse width control signal to the pulse width modulation circuit 404, and to generate a relay control signal based on the address signal and transmit the relay control signal to the relay signal generation circuit 406. For example, the required light-emitting duration of the light-emitting element connected to the micro drive chip 004 is acquired based on the data frame, and thus a corresponding pulse width control signal is generated based on the light-emitting duration. For example, the relay control signal is a signal generated after the data processing control circuit 403 processes the first input signal. By processing the address signal (e.g., parsing, latching, decoding, etc.), the address signal corresponding to the micro drive chip 004 is acquired, and a relay control signal corresponding to a subsequent address is generated. The subsequent address corresponds to the other micro drive chip 004. Optionally, the data processing control circuit 403 is implemented as a microcontroller, a central processing unit (CPU), a digital signal processor, or the like.

In some embodiments, the pulse width modulation circuit 404 is also electrically connected to the drive signal generation circuit 405, and is configured to generate a pulse width modulation signal in response to the pulse width control signal and to transmit the pulse width modulation signal to the drive signal generation circuit 405. For example, the pulse width modulation signal generated by the pulse width modulation circuit 404 determines the light-emitting duration of the light-emitting element. For example, an effective pulse width duration is equal to the light-emitting duration of the light-emitting element.

In some embodiments, the drive signal generation circuit 405 is also electrically connected to the output pad Out, and is configured to generate a drive signal in response to the pulse width modulation signal and to output the drive signal from the output pad Out. Outputting the drive signal from the output pad Out herein indicates that the drive signal (e.g., a drive current) flows from the output pad Out to the light-emitting element, or the drive signal (e.g., a drive current) flows from the light-emitting element to the output pad Out, wherein the specific direction of the current is not limited herein.

Exemplarily, in some embodiments, in a case where the drive signal is the drive current, the drive signal generation circuit 405 includes a current source A and a transistor MOS. A control electrode of the transistor MOS receives the pulse width modulation signal transmitted by the pulse width modulation circuit 404, such that the transistor MOS is on or off under control of the pulse width modulation signal. A first electrode of the transistor MOS is connected to the output pad Out, a second electrode of the transistor MOS is connected to a first electrode of the current source A, and a second electrode of the current source A is connected to the ground pad Gnd to receive a common voltage. Optionally, the current source A is a constant current source. In a case where the pulse width modulation signal is a valid level, the transistor MOS conducts, and the current source A provides the drive current through the output pad Out. In a case where the pulse width modulation signal is an invalid level, the transistor MOS cuts off, and at this time the output pad Out does not provide the drive current. The duration of the valid level of the pulse width modulation signal is equal to the conducting duration of the transistor MOS, and the conducting duration of the transistor MOS is equal to the duration of the drive current provided by the output pad Out. As a result, the light-emitting duration of the light-emitting element is further controlled, such that the visual brightness of the light-emitting element is controlled. In some embodiments, in a case where the transistor MOS conducts, the drive current flows from the output pad Out to the micro drive chip 004, and flows successively through the transistor MOS and the current source A, and then flows to a ground terminal (e.g., the ground pad Gnd). It should be noted that in the embodiments of the present disclosure, the drive signal generation circuit 405 is the form of other circuit structures, which is not limited herein.

In some embodiments, the relay signal generation circuit 406 is also electrically connected to the output pad Out, and is configured to generate a relay signal based on the relay control signal and to output the relay signal from the output pad Out. For example, the relay control signal corresponds to the subsequent address, and the relay signal generated based on the relay control signal contains the subsequent address that corresponds to the other micro drive chip 004. The relay signal, after being output from the output pad Out, is provided to the address pad Di of the next cascaded micro drive chip 004, such that the next cascaded micro drive chip 004 acquires the corresponding address signal. The relay signal generation circuit 406 is achieved by a latch, a decoder, an encoder, or the like, which is not limited herein.

It should be noted that in the embodiments of the present disclosure, although both the drive signal generation circuit 405 and the relay signal generation circuit 406 are electrically connected to the output pad Out, the drive signal generation circuit 405 and the relay signal generation circuit 406 respectively output the drive signal and the relay signal at different periods, and the drive signal and the relay signal are transmitted time-sharingly through the output pad Out, and thus the two types of signals do not affect each other.

In some embodiments, the power supply circuit 407 is electrically coupled to the demodulation circuit 401 and the data processing control circuit 403, and is configured to receive electrical power and to power the data processing control circuit 403. In some embodiments, after the demodulation circuit 401 demodulates the power line carrier communication signal inputted by the power supply pad Pwr, the electrical power in the power line carrier communication signal is transmitted to the power supply circuit 407, and is then supplied by the power supply circuit 407 to the data processing control circuit 403. The embodiments of the present disclosure are not limited to this, and the power supply circuit 407 is further electrically connected to the micro drive chip 004 to provide electrical power. The power supply circuit 407 is achieved by switching circuits, voltage conversion circuits, and voltage stabilizing circuits, which is not limited herein.

It should be noted that the micro drive chip 004 according to the present disclosure also includes more circuits and elements, not limited to the demodulation circuit 401, the physical layer interface circuit 402, the data processing control circuit 403, the pulse width modulation circuit 404, the drive signal generation circuit 405, the relay signal generation circuit 406, and the power supply circuit 407 described above, which may depend on the functionality that needs to be achieved, and the embodiments of the present disclosure are not limited herein.

Although embodiments have been described in the present disclosure, it should be understood that those skilled in the art may make various modifications and variations to the embodiments of the present disclosure without departing from the spirit and scope of the embodiments of the present disclosure. Thus, to the extent that such modifications and variations of the embodiments of the present disclosure fall within the scope of the claims of the present disclosure and their technical equivalents, the present disclosure is intended to encompass such modifications and variations as well.

The invention claimed is:

1. A wiring substrate, comprising:

a base substrate;

a plurality of constant voltage signal lines and a plurality of first connection lines that are disposed on a same side of the base substrate;

a plurality of first pad regions, wherein each of the first pad regions comprises a plurality of sub-regions arranged in parallel, each of the sub-regions comprising a plurality of pad groups arranged in series, the plurality of pad groups arranged in series comprising at least a first pad group and a last pad group, an orthographic projection of either the first pad group or the last pad group on the base substrate being partially overlapped with an orthographic projection of one of the constant voltage signal lines on the base substrate, an orthographic projection of other of the first pad group or the last pad group on the base substrate being partially overlapped with an orthographic projection of one of the first connection lines on the base substrate.

2. The wiring substrate according to claim 1, wherein either the first pad group or the last pad group is coupled to one of the constant voltage signal lines, and other of the first pad group or the last pad group is coupled to one of the first connection lines.

3. The wiring substrate according to claim 1, wherein the plurality of first pad regions are arranged in an array, each of the constant voltage signal lines extends along a first direction, each of the first connection lines extends along the first direction, and the plurality of the constant voltage signal lines are spaced apart along a second direction.

4. The wiring substrate according to claim 3, further comprising: a second connection line, wherein the plurality of pad groups in the sub-region are connected in series by the second connection line.

5. The wiring substrate according to claim 4, wherein an extension direction of the second connection line is intersected with an extension direction of a respective first connection line.

6. The wiring substrate according to claim 1, further comprising: a plurality of second pad regions, wherein each of the second pad regions comprises an output pad, the output pad being connected to at least one of the first pad regions.

7. The wiring substrate according to claim 6, wherein at least two of the plurality of second pad regions are coupled by one of the first connection lines.

8. The wiring substrate according to claim 7, wherein each of the plurality of second pad regions further comprises an address pad, and one end of at least one of the first connecting lines is connected to the output pad of one of the second pad regions, and other end of the first connecting line is connected to the address pad of other of the second pad regions.

9. The wiring substrate according to claim 6, further comprising: a plurality of common voltage signal lines, wherein each of the common voltage signal lines extends along a first direction, the plurality of common voltage signal lines are spaced apart along a second direction, each of the second pad regions further comprises a ground pad, the plurality of second pad regions are arranged in an array, and the ground pads of the plurality of the second pad regions arranged along the first direction are, respectively, connected to one of the common voltage signal lines.

10. The wiring substrate according to claim 9, wherein a ratio of a width of each of the constant voltage signal lines to a width of each of the common voltage signal lines is greater than or equal to 0.5 and less than or equal to 1.5.

11. The wiring substrate according to claim 1, wherein a ratio of a width of each of the constant voltage signal lines to a width of each of the first connection lines is greater than or equal to 4 and less than or equal to 10.

12. The wiring substrate according to claim 1, wherein each of the first pad regions comprises two of the plurality of sub-regions arranged in parallel, wherein one of the two sub-regions comprises a first pad group and a second pad group that are arranged in series, and other of the two sub-regions comprises a third pad group and a fourth pad group that are arranged in series;

wherein the first pad group is juxtaposed with the second pad group in a second direction and is juxtaposed with the third pad group in a first direction, and the fourth pad group is juxtaposed with the second pad group in the first direction and is juxtaposed with the third pad group in the second direction.

13. An electronic device, comprising: a wiring substrate and an electronic element; wherein the wiring substrate comprises:

a base substrate;

a plurality of constant voltage signal lines and a plurality of first connection lines that are disposed on a same side of the base substrate;

a plurality of first pad regions, wherein each of the first pad regions comprises a plurality of sub-regions arranged in parallel, each of the sub-regions comprising a plurality of pad groups arranged in series, the plurality of pad groups arranged in series comprising at least a first pad group and a last pad group, an orthographic projection of either the first pad group or the last pad group on the base substrate being partially overlapped with an orthographic projection of one of the constant voltage signal lines on the base substrate, an orthographic projection of other of the first pad group or the last pad group on the base substrate being partially overlapped with an orthographic projection of one of the first connection lines on the base substrate; and the electronic element is connected to the first pad region.

14. The electronic device according to claim 13, further comprising: a first transparent protection structure, wherein an orthographic projection of the first transparent protection structure on the base substrate covers an orthographic projection of the electronic element on the base substrate.

15. The electronic device according to claim 13, further comprising: a micro drive chip and a second transparent protection structure, wherein the micro drive chip is connected to a second pad region, and an orthographic projection of the second transparent protection structure on the base substrate covers an orthographic projection of the micro drive chip on the base substrate.

16. The electronic device according to claim 13, wherein either the first pad group or the last pad group is coupled to one of the constant voltage signal lines, and other of the first pad group or the last pad group is coupled to one of the first connection lines.

17. The electronic device according to claim 13, wherein the plurality of first pad regions are arranged in an array, each of the constant voltage signal lines extends along a first direction, each of the first connection lines extends along the first direction, and the plurality of the constant voltage signal lines are spaced apart along a second direction.

18. The electronic device according to claim 17, wherein the wiring substrate further comprises a second connection line, the plurality of pad groups in the sub-region being connected in series by the second connection line.

19. The electronic device according to claim 18, wherein an extension direction of the second connection line is intersected with an extension direction of a respective first connection line.

20. The electronic device according to claim 13, wherein the wiring substrate further comprises a plurality of second pad regions, wherein each of the second pad regions comprises an output pad, the output pad being connected to at least one of the first pad regions.

\* \* \* \* \*